United States Patent [19]
Himi et al.

[11] Patent Number: 5,525,824
[45] Date of Patent: Jun. 11, 1996

[54] SEMICONDUCTOR DEVICE WITH ISOLATION REGIONS

[75] Inventors: Hiroaki Himi, Nagoya; Harutsugu Fukumoto, Anjo; Seiji Fujino, Toyota, all of Japan

[73] Assignee: Nippondenso Co., Ltd., Kariya, Japan

[21] Appl. No.: 337,832

[22] Filed: Nov. 8, 1994

[30] Foreign Application Priority Data

Nov. 9, 1993 [JP] Japan .................... 5-279410

[51] Int. Cl.$^6$ .................... H01L 29/76; H01L 29/94; H01L 31/062; H01L 31/113
[52] U.S. Cl. .................... 257/370; 257/374; 257/376; 257/397; 257/398
[58] Field of Search .................... 257/547, 374, 257/510, 370, 372, 396, 397, 376, 398

[56] References Cited

U.S. PATENT DOCUMENTS

| | | | |
|---|---|---|---|
| 4,466,011 | 8/1984 | Van Zanten | 257/547 |
| 4,633,290 | 12/1986 | Poppert et al. | 257/374 |
| 4,819,052 | 4/1989 | Hutter | 257/374 X |
| 4,851,366 | 7/1989 | Hunter | 437/61 |
| 4,980,747 | 12/1990 | Hutter et al. | 357/50 |
| 5,045,904 | 9/1991 | Kobayashi et al. | 357/23.6 |
| 5,072,287 | 12/1991 | Nakagawa et al. | 357/50 |
| 5,111,274 | 5/1992 | Tomizuka et al. | 257/547 X |

FOREIGN PATENT DOCUMENTS

| | | | |
|---|---|---|---|
| 60-132343 | 7/1985 | Japan | 257/374 |
| 61-59853 | 3/1986 | Japan . | |
| 63-58817 | 3/1988 | Japan . | |
| 1-253265 | 10/1989 | Japan . | |
| 2-96350 | 4/1990 | Japan . | |
| 2-168646 | 6/1990 | Japan . | |
| 2-161748 | 6/1990 | Japan . | |
| 2-194645 | 8/1990 | Japan . | |
| 3-105944 | 5/1991 | Japan . | |

*Primary Examiner*—William Mintel
*Attorney, Agent, or Firm*—Cushman, Darby & Cushman

[57] ABSTRACT

A multi-channel type intelligent power IC which solves the problems of parasitic transistor and increase in an area of isolation region, both of which are inherent problem in a pn junction isolation substrate. The power IC also enhances heat-radiation performance. An n type first semiconductor substrate and p type second semiconductor substrate are directly bonded, and a buried oxide film is formed in a portion of a bonding interface thereof. Subsequently, a plurality of isolation trenches are formed and the first semiconductor substrate is separated into an SOI isolation region and a pn isolation region. Logic elements are then formed in the SOI isolation region, and power elements are formed in the pn isolation region. In the case wherein two or more logic elements are hereby formed, the logic elements are isolated by isolation trenches. In the case wherein two or more power elements are formed, a parasitic current extracting portion is formed between mutual power elements.

16 Claims, 11 Drawing Sheets ns 5,525,824

SEMICONDUCTOR DEVICE WITH ISOLATION REGIONS

CROSS REFERENCE TO RELATED APPLICATION

This application claims the benefit of priority of the prior Japanese application No. 5-279410 filed on Nov. 9, 1993, the contents of which are incorporated herein by reference.

BACKGROUND OF THE INVENTION

1. Field of the Invention

The present invention relates to a semiconductor device integrating a plurality of power elements on a single chip and a method of producing same. More particularly, the present invention relates to a semiconductor device wherein the respective power elements are electrically isolated by means of pn isolation and a method of producing same.

2. Description of the Related Arts

Conventionally, a semiconductor device formed on a pn junction isolation substrate, as shown in FIG. 8, includes a plurality of power elements and a control circuit thereof on a single chip. However, a semiconductor device employing a pn junction isolation substrate as shown in FIG. 8 may not operate properly because of parasitic transistors formed via an isolation region between mutually adjacent power elements and between power elements and a logic portion as indicated in FIG. 9. In order to prevent this, conventional devices increase the width of the isolation region between elements. For example, if the withstand voltage is set at 60 V and the doping concentration of the first semiconductor substrate is set at $1 \times 10^{15}$ cm$^{-3}$, it is necessary to set the current amplification rate $h_{FE}$ of the parasitic npn transistor to $10^{-6}$ or less to prevent parasitism, but to do this the foregoing interval (the width of the isolation region) is required to be approximately 100 μm. Because of this, there exists the disadvantage of an increase in overall element size.

It is also known to provide another p type region or guard ring between the isolation region and the power elements to reduce the $h_{FE}$ of parasitic npn transistors produced between power elements to prevent parasitic transistors in pn isolation. However, a region for disposition of the guard ring becomes necessary. The region required for isolation is equal to or greater than the case wherein a guard ring is not employed. As a result, there exists the disadvantage of an increase in overall element size in the same manner as in the semiconductor device shown in FIG. 9.

In order to avoid the foregoing disadvantage of element enlargement, formation of a semiconductor device employing an isolation substrate as shown in FIG. 10 has been performed. In this device, there exists, for example, an article integrating an up-drain type lateral DMOS employing a complete SOI substrate which has a buried oxide in a whole wafer and isolating between adjacent elements with trenches as indicated in FIG. 10.

In semiconductor device shown in FIG. 10, because isolation between elements is not performed by means of an isolation region or a guard ring, parasitic transistors are not produced, and there is no disadvantage of enlargement of elements. However, the heat-radiating performance is poor because elements are structured in a partition which is completely enclosed by silicon dioxide of poor thermal conductivity. Furthermore in the case wherein a power element is formed in this partition, there exists the disadvantage of a reduction of the upper limit for usage temperature.

Moreover, a structure eliminating the silicon dioxide at the bonding interface in consideration of heat-radiating performance as shown in FIG. 11 is known, but there still exists the disadvantage of faulty operation caused by parasitic transistors.

In short, it has not been possible to obtain a semiconductor device which prevents faulty operation due to parasitic transistors while ensuring heat-radiation performance, and which also has no overall element enlargement.

SUMMARY OF THE INVENTION

Accordingly, it is an object of the present invention to provide a semiconductor device which prevents faulty operation due to parasitic transistors while ensuring heat-radiation performance, and which also has no overall element enlargement.

A semiconductor device according to the present invention structured so as to attain the foregoing object, comprises a first semiconductor substrate of a first conductivity type, abraded to a specified thickness from a bonding interface to an element formation main surface. A second semiconductor substrate of a second conductivity type is bonded to the first semiconductor substrate so as to form a pn junction at the bonding interface. A first power element and a second power element are formed on the first semiconductor substrate. A plurality of isolation trenches for electrically isolating the first power element and the second power element are formed in the first semiconductor substrate between the first power element and the second power element so as to reach the bonding interface from the element formation main surface. A parasitic current extracting region is disposed between the first power element and the second power element in the first semiconductor substrate so as to electrically isolate the first power element and the second power element by means of the plurality of isolation trenches, the extracting region having a potential established to be lower than either the first power element or the second power element.

When the electrical potential of the first power element becomes lower than the second semiconductor substrate, the pn junction between the first and second substrates, which is located under the first power element, is forward biased (the p side is of higher potential than the n side), and so the parasitic transistors formed between the first power element, second semiconductor substrate, and second power element are switched on and current attempts to flow from the second power element through the second semiconductor substrate to the first power element. In a semiconductor device according to the present invention structured as described above, however, because the potential of the parasitic current extracting region formed between the first and second power elements is established to be lower than either the first power element or the second power element, current conducted to the second semiconductor substrate from the second power element is absorbed by this parasitic current extracting region and extracted.

Additionally, the combined surface area of this parasitic current extracting region and the isolation trenches on the two sides thereof can be made substantially smaller in comparison with the surface area in the case of formation of an isolation region and guard ring according to the conventional devices. Further, because the power element formation area is not enclosed by oxide film, heat-radiating performance can also be ensured. Consequently, a semiconductor device which prevents faulty operation due to parasitic transistors while ensuring heat-radiation performance, and which also has no overall element enlargement, is obtained.

Moreover, in the foregoing structure it is also acceptable to provide a plurality of buried oxide film layers formed by burying oxide film within a portion of the bonding interface. A logic element may be provided on the first semiconductor substrate at a region on the buried oxide film.

Furthermore, a method of production of a semiconductor device according to the present invention includes: a surface polishing step wherein at least one main surface of a first semiconductor substrate of a first conductivity type is mirror-polished and at least one main surface of a second semiconductor substrate of a second conductivity type is mirror-polished; a concavity formation step which forms two shallow first concavities on the mirror-polished surface of the first semiconductor substrate where a buried oxide layer is to be formed, and further forming on both respective ends of the two first concavities two second concavities which are deeper than the first concavities for the purpose of forming isolation trenches; a doping step which introduces first conductivity type impurities of high-concentration from the mirror-polished surface of the first semiconductor substrate or the second semiconductor substrate; a substrate bonding step which directly joins the mutual mirror-polished surfaces of the first semiconductor substrate and the second semiconductor substrate; an oxidation step which heats the directly joined first and second semiconductor substrates in an oxidizing atmosphere to form an oxide film in a space enclosed by the first concavities and the second semiconductor substrate and in a space enclosed by the second concavities and the second semiconductor substrate, further burying these spaces with oxide film to form the buried oxide film layer and the isolation trenches; a grinding step which grinds the first semiconductor substrate from an element formation main surface thereof so as to leave a specified thickness from a bonding interface until the isolation trenches are exposed; and a power element formation step which forms a plurality of power elements on both sides of the isolation trenches of the polished first semiconductor substrate.

In the methods of production of a semiconductor device according to the present invention, first concavities and second concavities are formed in a first semiconductor substrate before bonding the first semiconductor substrate and second semiconductor substrate, and by performed heat treatment after bonding, these first concavities and second concavities are buried with oxide film. By means of this, the parasitic current extracting region, isolation trenches on both sides of the parasitic current extracting region, and buried oxide film contacting these isolation trenches can be formed easily.

As described above, according to the present invention, a semiconductor device which prevents faulty operation due to parasitic transistors while ensuring heat-radiation performance, and which also has no overall element enlargement, is obtained.

BRIEF DESCRIPTION OF THE DRAWINGS

Other objects, features and characteristics of the present invention will be appreciated from a study of the following detailed description, the appended claims, and drawings, all of which form a part of this application. In the drawings:

DETAILED DESCRIPTION OF THE EMBODIMENTS

A first embodiment of a semiconductor device according to the present invention will be described hereinafter with reference to the drawings.

Figure 1:
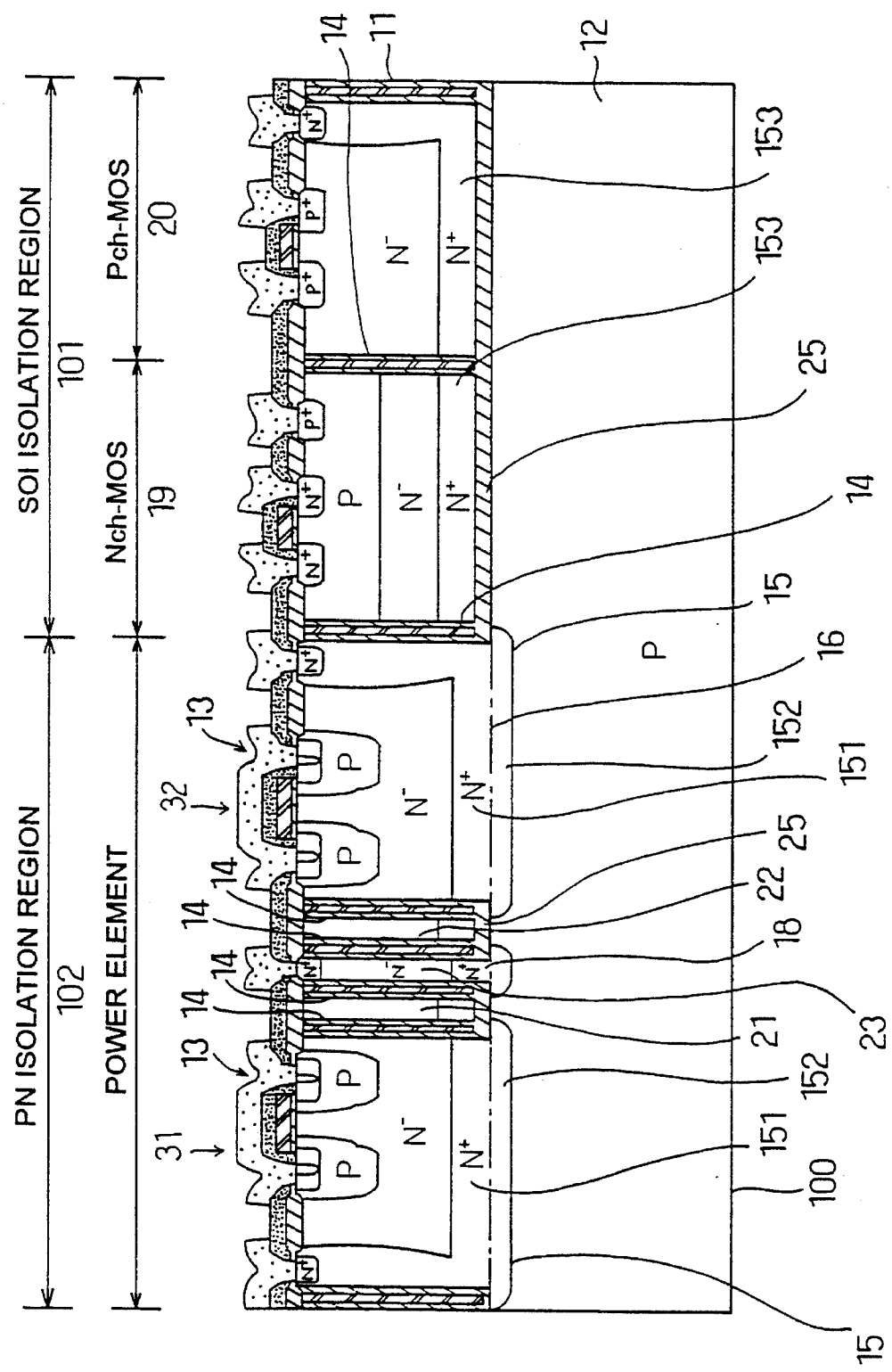
FIG. 1 shows a sectional view of a semiconductor device according to a first embodiment of the present invention.

FIG. 1 is a sectional view depicting the structure of a semiconductor device relating to the present embodiment. In this embodiment, n type corresponds to a first conductivity type, and p type corresponds to a second conductivity type.

An n type semiconductor substrate 11 which becomes the side for element formation and a p type semiconductor substrate 12 which becomes the support substrate are directly bonded to constitute a partial SOI substrate 100 employed in this embodiment. At the bonding interface 16 with no buried oxide film layer 25, a doping layer 15 of an n type high-concentration layer is formed sandwiching the bonding interface 16 on both sides thereof. This layer is composed of a drain buried layer 151 of up-drain type DMOS 13 and like formed in the direct bonding region and a diffuse layer 152 diffused at the time of formation. By means of doping layer 15, the pn junction between the n type semiconductor substrate 11 and the p type semiconductor substrate 12 can be shifted from the bonding interface 16 toward the p type semiconductor substrate 12. In the case wherein the pn junction is formed at the bonding interface 16, a level of the recombination center is formed in the vicinity of the bonding interface 16, current flowing in reverse (from n to p) increases, and the electrical isolation, which is the object of pn isolation, becomes inadequate. However, pn isolation can be made sufficient by means of shifting the pn junction from the bonding interface 16 toward the p type semiconductor substrate 12.

Employing this partial SOI substrate 100, power elements 13 such as up-drain type DMOS power elements 31, 32 are formed in a pn isolation region 102 (direct silicon-silicon bonding region), and a logic element such as a CMOS inverter constituted of an n-channel type MOS transistor 19 and a p-channel type MOS transistor 20 are formed in an SOI isolation region 101. The SOI isolation region 101 is isolated from the pn isolation region 102 in the lateral direction by means of isolation trenches 14, and if necessary, isolation trenches 14 are formed in the SOI isolation region 101 to separate the n-channel type MOS transistor 19 and the p-channel type MOS transistor 20. By means of this configuration, in the power element portion, heat generated by the power element can be allowed to escape effectively to the p type semiconductor substrate 12 as a heat sink, and in the logic element portion it becomes possible to prevent interference by electrical noise and also to eliminate latchup.

Furthermore, according to this embodiment two narrow SOI island regions 21 and 22 partitioned at both ends with the isolation trenches 14 employing partial SOI technology and a parasitic current extracting portion 23 are formed between a plurality of power elements 31, 32 formed in the pn isolation region 102. The parasitic current extracting region 23 is electrically biased via a surface electrode to be lower than or equal to the lowest one of the electric potentials to which the power elements 31, 32 are applied. For example, the parasitic current extracting region 23 is grounded. By forming parasitic current extracting portion 23, it is possible to prevent electrical interference and faulty operation due to interference between adjacent power elements arising from parasitic npn transistors generated between the buried drain layer 151 and the second semiconductor substrate 12 between adjacent power elements 31, 32. This is because an npn transistor is formed via the substrate 12 between a buried high-concentration layer 18 of the parasitic current extracting portion 23 and the buried drain layer 151, and interference current is extracted to the buried high-concentration layer 18 of the parasitic current extracting portion 23. Additionally, the buried high-concentration layer 18 of the parasitic current extracting portion 23 is formed simultaneously with the buried drain layer 151 of the foregoing power element. However, it is also acceptable to perform formation by a separate process according to need.

Figure 8:
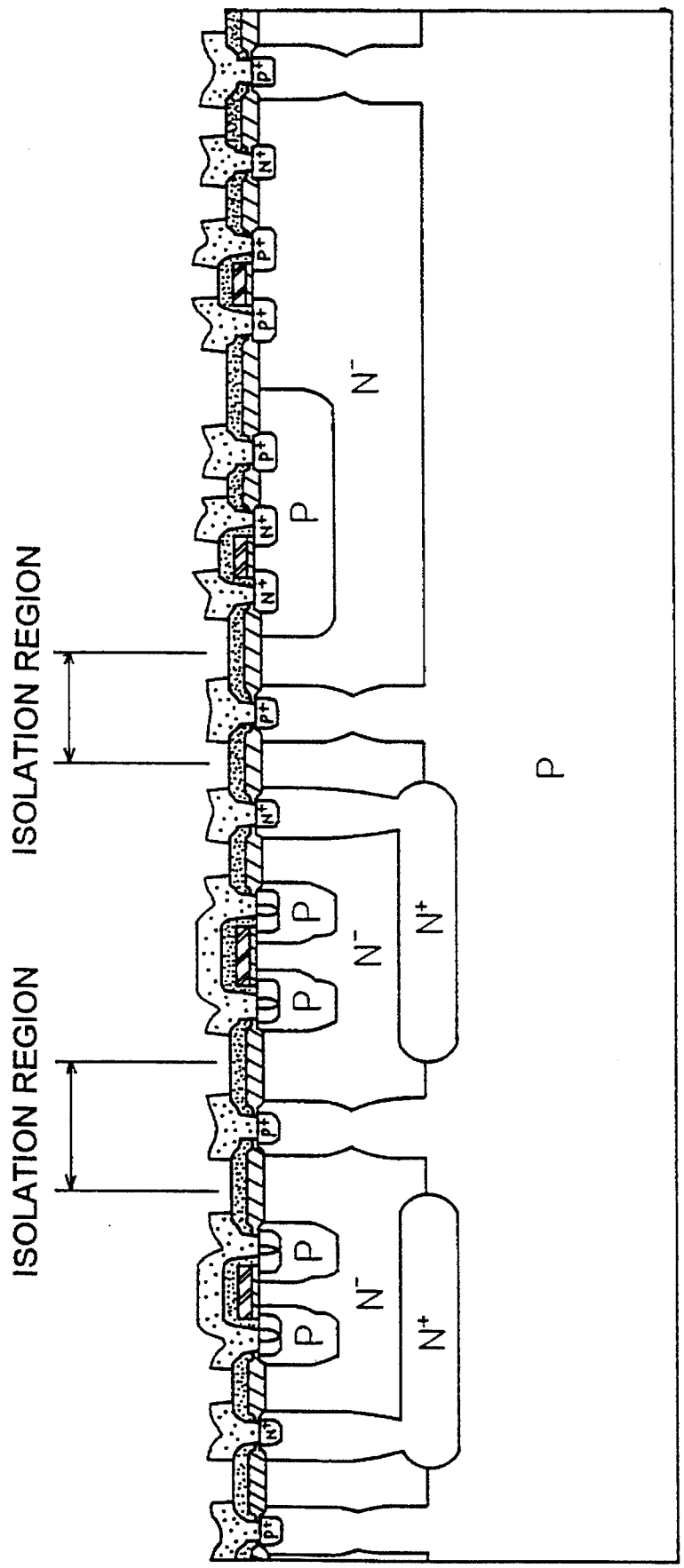
FIG. 8 and FIG. 9 each illustrate a conventional semiconductor device employing a pn isolation substrate.
Figure 9:
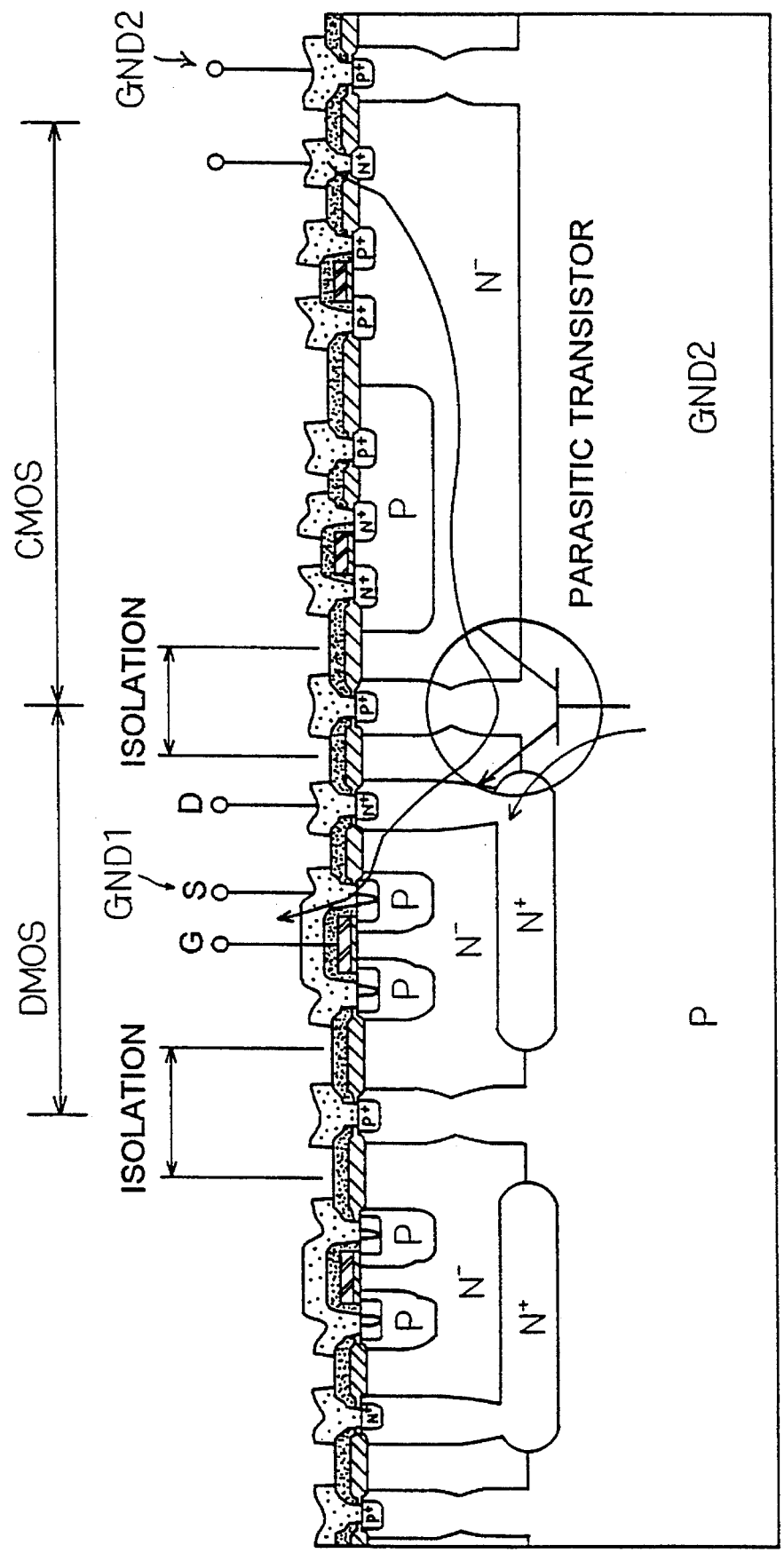
Figure 10:
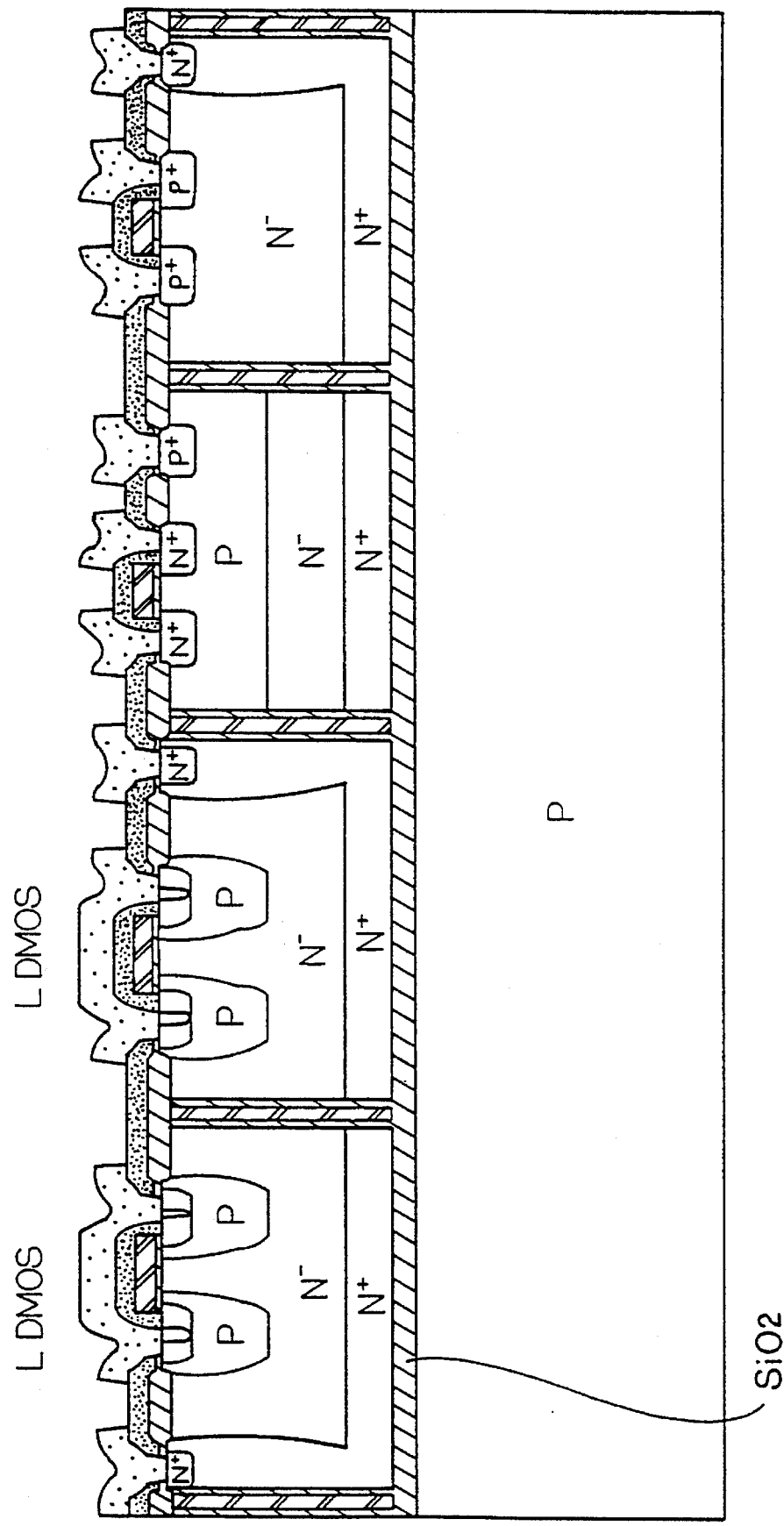
FIG. 10 shows a conventional semiconductor device employing a complete SOI isolation substrate.
Figure 11:
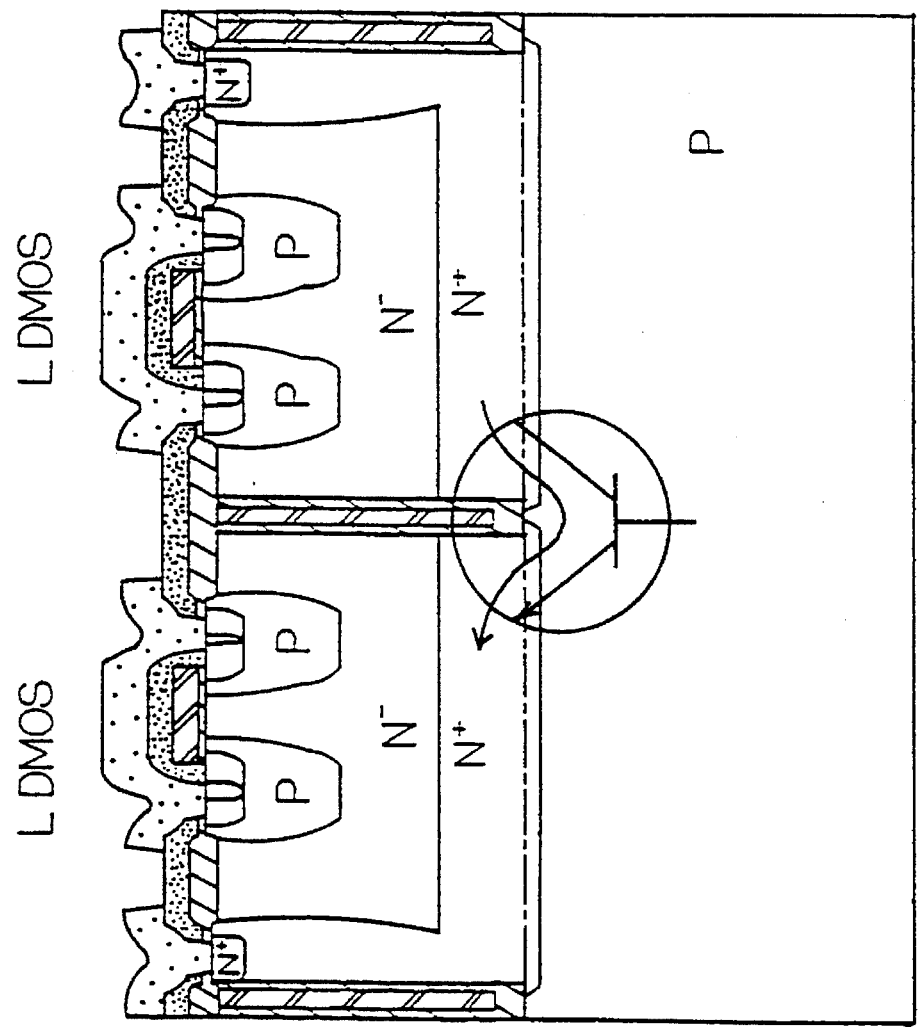
FIG. 11 shows a conventional semiconductor device employing a partial SOI isolation substrate.

Moreover, the SOI regions 21 and 22 provided on both sides of the parasitic current extracting portion 23 are disposed to maintain an adequate interval such that the buried high-concentration layer 18 and buried drain layer 151 (152) are laterally diffused and not in mutual contact, and such that a drop in withstand voltage due to reach-through does not occur. In other words, by increasing the width of the SOI regions 21 and 22, even though the diffusion layer 152 is spread to the side of the p type semiconductor substrate 12, mutual overlapping of adjacent doping layers 15 (152) is eliminated and mutual electrical isolation between the foregoing first and second power elements 31, 32 can be sufficiently produced. If, for example, the diffusion distance of the buried drain layer 151 is made 3 µm, the withstand voltage is made 60 V, and the doping concentration of the p type semiconductor substrate 12 is made $1 \times 10^{15}$ cm$^{-3}$, the width of the SOI regions 21 and 22 in FIG. 1 is approximately 10 µm. It can be appreciated that this interval is much smaller in comparison with the isolation region width required in the case of pn isolation according to the prior art depicted in FIG. 8.

Figure 2:
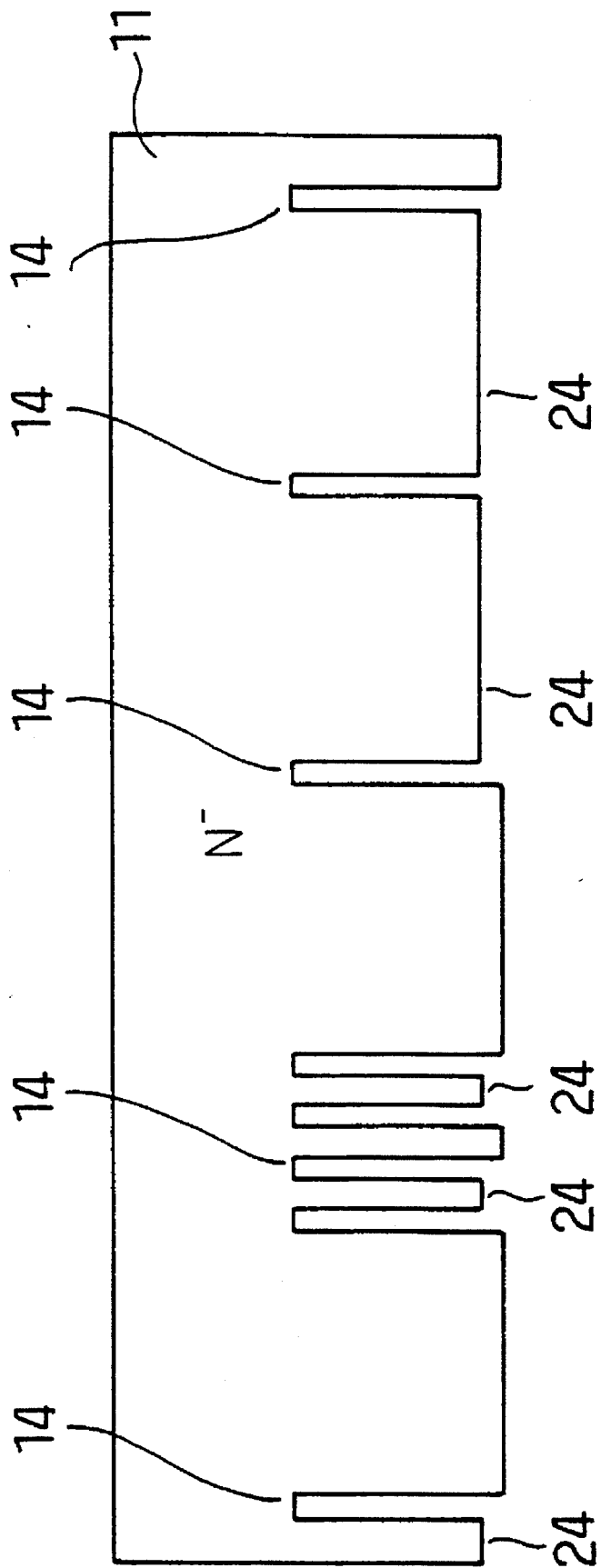
FIG. 2 through FIG. 7 show sectional views, each depicting an intermediate structure in the corresponding production process for the semiconductor device shown in FIG. 1.

Next, a method of production for the partial SOI substrate 100 and semiconductor device relating to this embodiment will be described with reference to FIG. 2 to FIG. 7. First, with the method disclosed in Japanese Patent Application Laid-open No. 2-96350, normal photolithographic process and silicon dry-etching technology are employed to form concavities 24 at the site on the mirror-polished surface of the n type first semiconductor substrate 11 that will define the SOI isolation region 101 and the SOI islandish regions 21, 22. Next, trench-etching technology is employed to form trenches 14 deeper than the concavities 24 and open to the side surfaces of the first semiconductor substrate 11 in the portion that will isolate the elements and the two ends of the concavities 24 of the first semiconductor substrate (FIG. 2).

Figure 3:
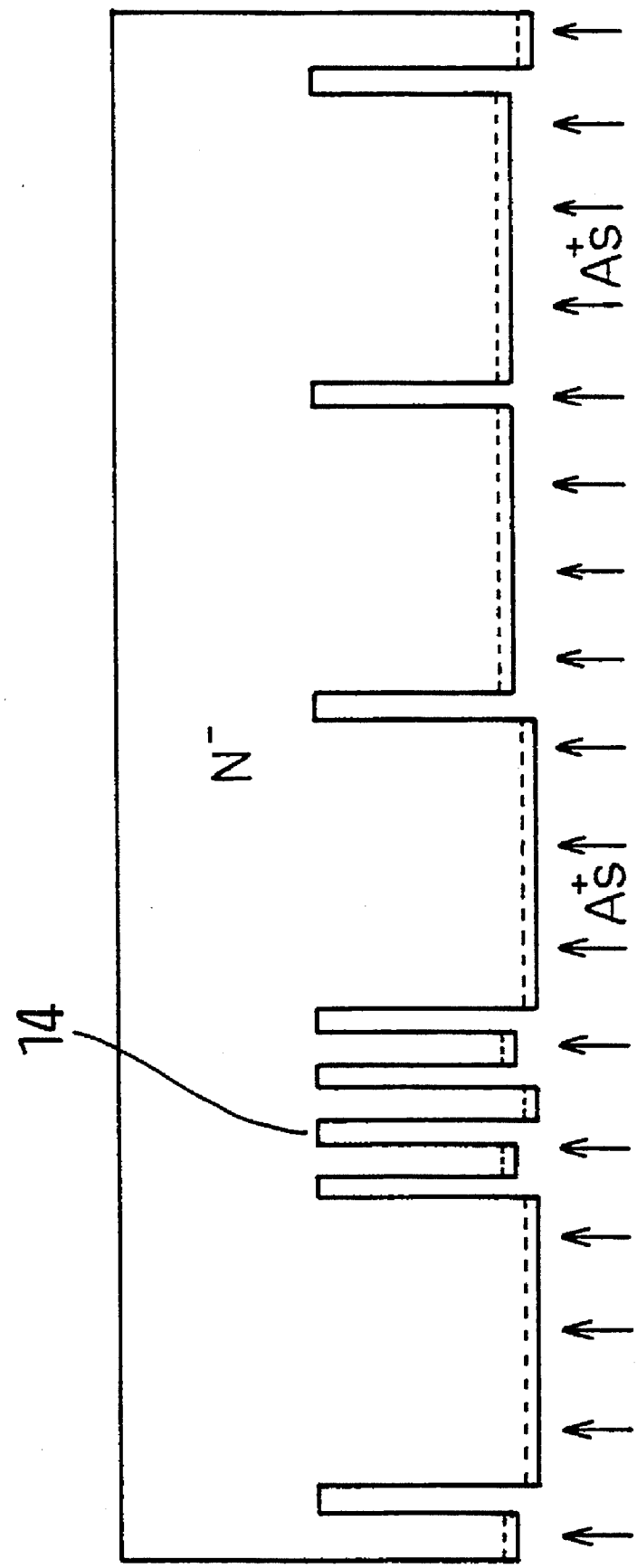
Figure 4:
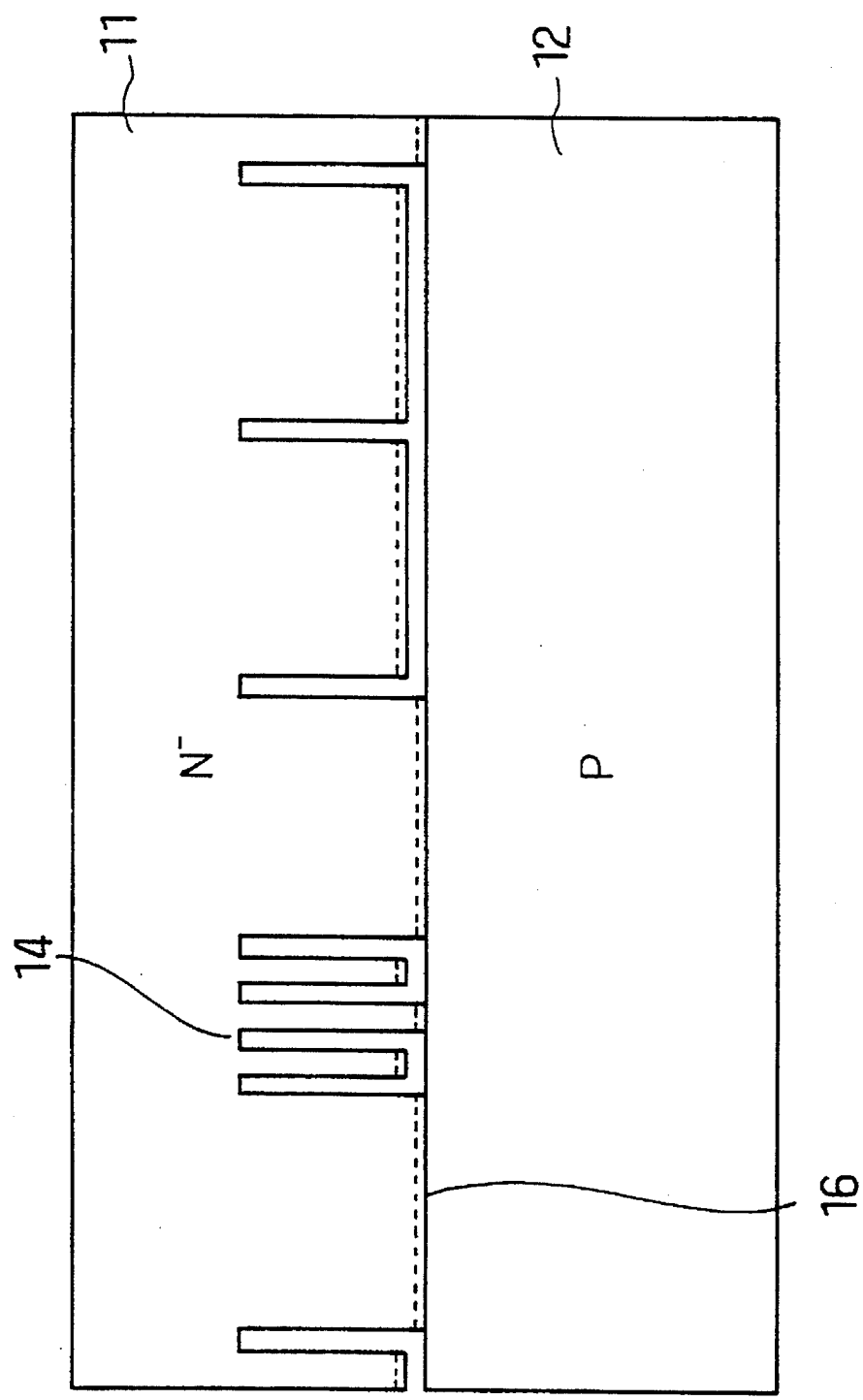
Figure 5:
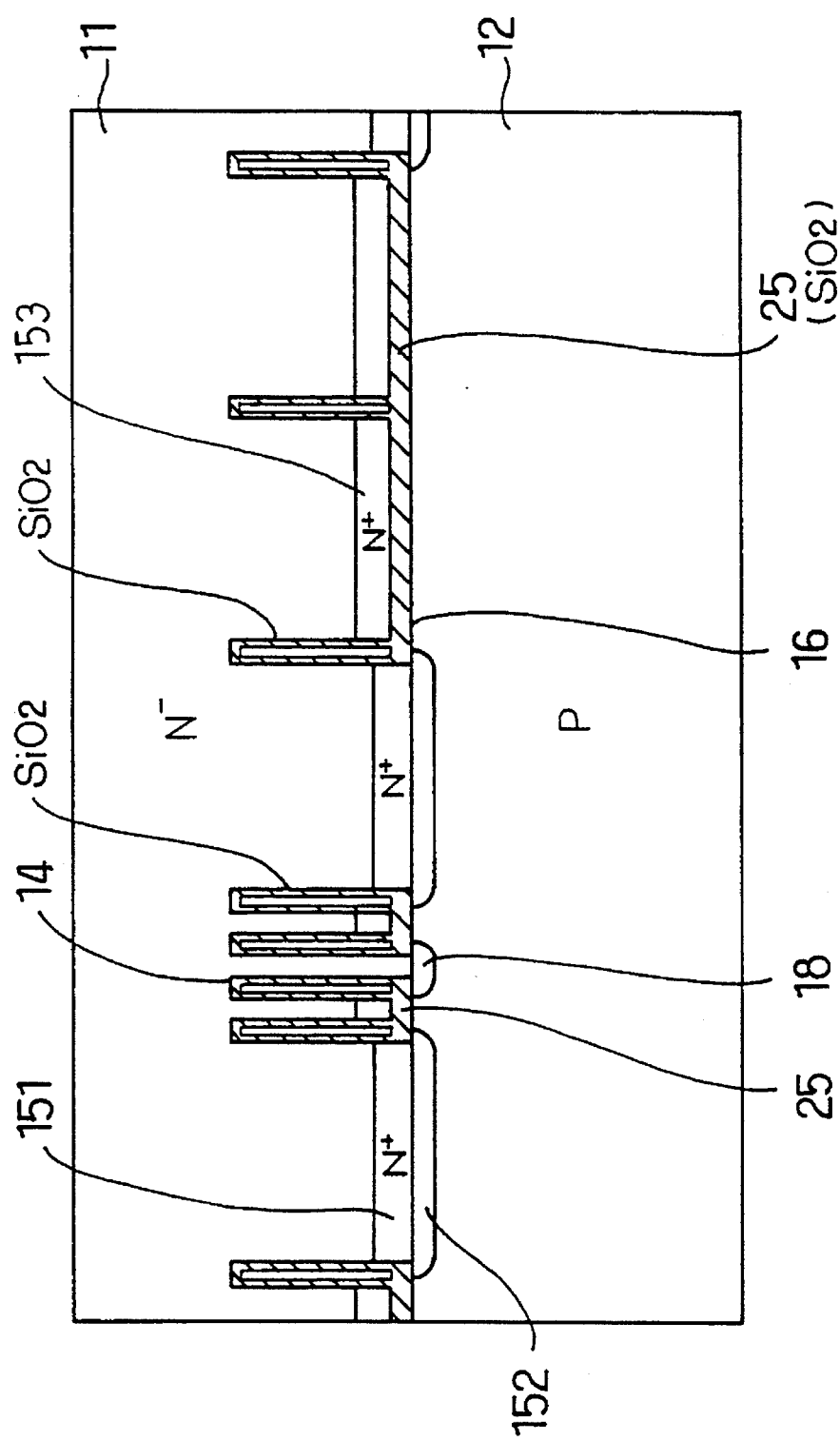

Next, the entire mirror-polished surface of the first semiconductor substrate 11 formed with concavities 24 and trenches 14 is doped with an impurity atom (for example As+) of the same n type as the first semiconductor substrate 11 using the ion-implantation method or the like (FIG. 3). Here, the conductive type of the first semiconductor substrate 11 is made to be n$^+$, approximately $1 \times 10^{15}$ to $1 \times 10^{16}$ cm$^{-2}$ of an n type dopant such as As+ or the like is implanted. Next, the mutual mirror-polished surfaces of the n type first semiconductor substrate 11 and a p type second semiconductor substrate 12 are directly joined and bonded to form a bonded wafer (FIG. 4). Next, this bonded wafer is heated in an oxidizing atmosphere to form oxide film 25 in the spaces enclosed by the concavities 24 and the second semiconductor substrate 12, filling these spaces with oxide film 25 (FIG. 5). At this time, oxygen and the like enter from the foregoing openings on the side surfaces of the first semiconductor substrate 11 and cause oxidation of the interior enclosed by the trenches 14. At this time the n type dopant, which is implanted in the bonding surface of the first semiconductor substrate 11 in the foregoing step (FIG. 3), is diffused vertically and laterally by high-temperature heat treatment at the time of bonding and at the time of burying oxidation, thereby forming a buried drain layer 151, high-concentration layer 18 of a parasitic current extracting portion 23, shield layer 153 (FIG. 1) of the SOI isolation region 101, and the like.

Figure 6:
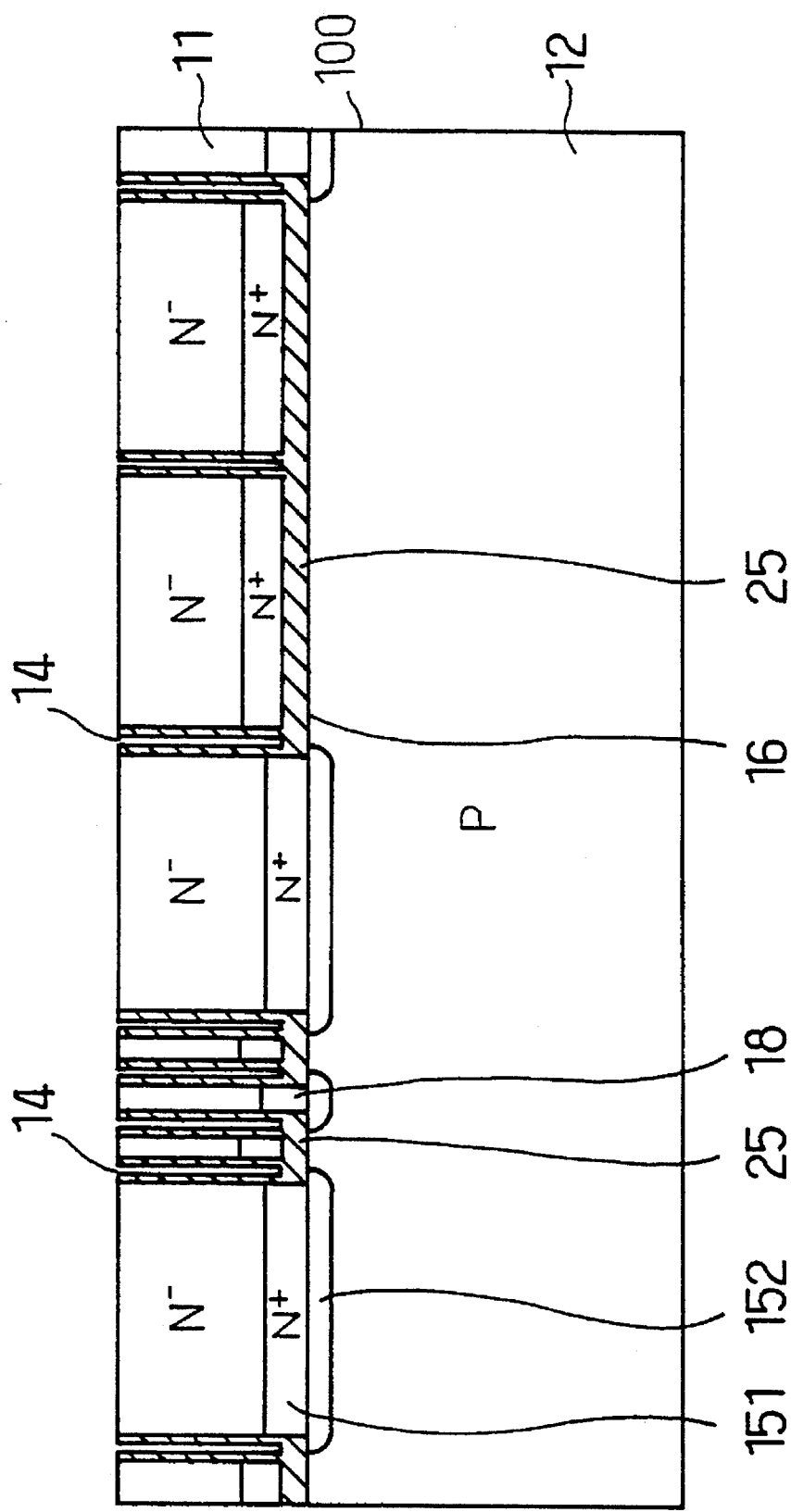
Figure 7:
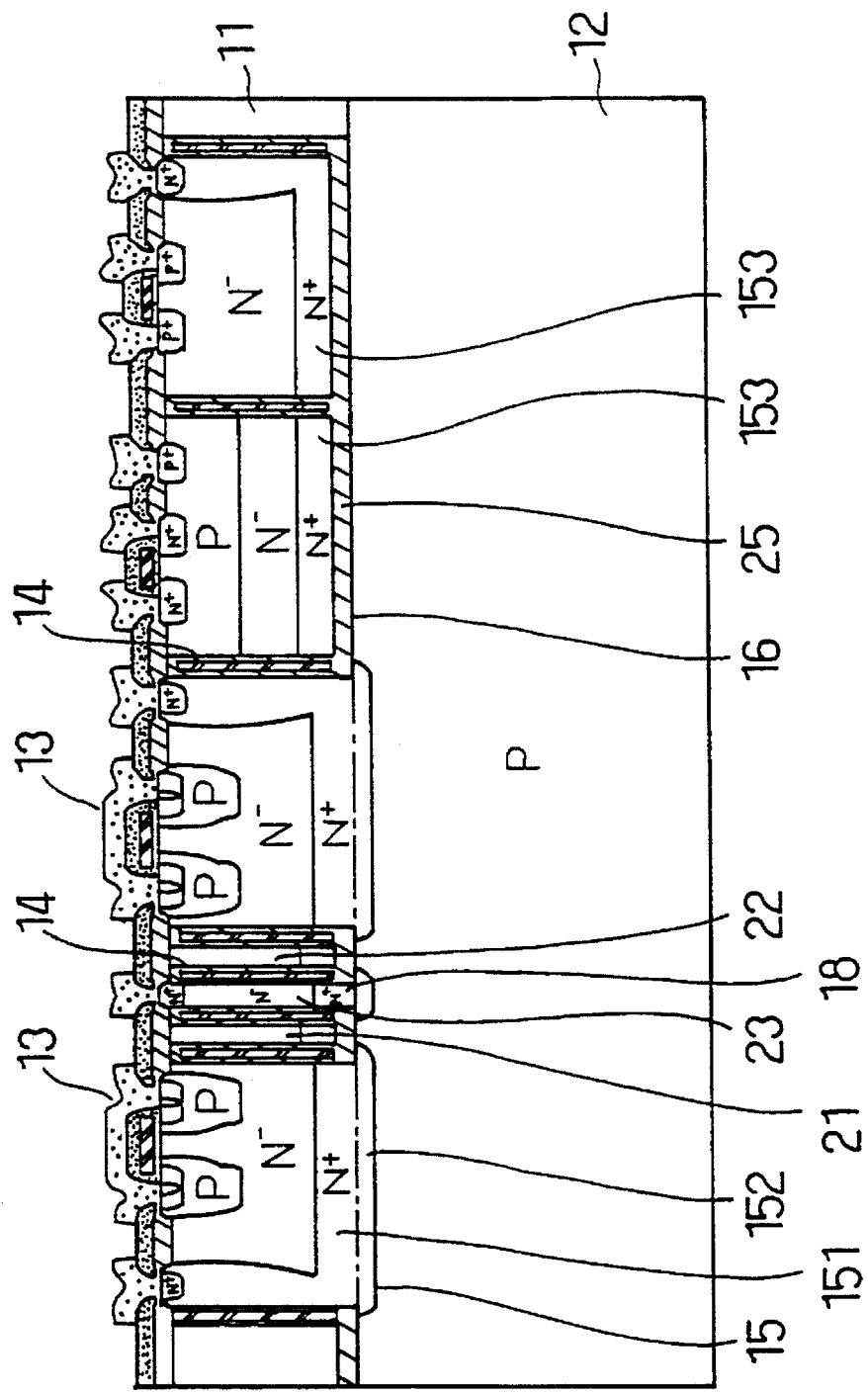

After forming the bonded wafer in this manner, the foregoing first semiconductor substrate 11 is ground and polished from a side opposite the bonding interface 16 so as to leave a specified thickness from the junction surface 16 and moreover cause the above-described trenches 14 to be exposed, thereby obtaining a partial SOI substrate 100 (FIG. 6). Subsequently, normal device forming process is followed to obtain an intelligent power IC by means of forming logic elements such as CMOS inverter on the SOI isolation region 101 and forming power elements 13 such as up-drain type DMOS transistors 31, 32 isolated between elements by isolation trenches 14 on the pn isolation region 102 (direct silicon-silicon bonding region) (FIG. 7.).

As described above, since the isolation between adjacent power elements is performed by the isolation trenches 14 according to the present embodiment, it becomes possible to prevent the generation of the npn parasitic transistors that were a problem in pn isolation. Consequently, it becomes possible to minimize the regional width required for isolation, and greater element compactness can be expected.

Moreover, in the case wherein n-channel type MOS transistor 19 and p-channel type MOS transistor 20 are formed in the SOI isolation region 101, the latchup phenomenon, which is inherent in CMOS, can be prevented by means of isolating between elements with the isolation trenches 14.

Additionally, because power elements are formed in the pn isolation region 102, heat generated by the power element portion can effectively be allowed to escape to a substrate heat sink. Furthermore, although it is necessary to maintain a distance of a certain value or greater between the isolation region and the respective elements in order to ensure required withstand voltage by pn isolation, according to the present embodiment the area for the isolation region can be minimized because trench isolation is conducted.

In addition, by disposing a direct bonding region 23 between adjacent power elements as shown in FIG. 1, parasitic current generated in the case wherein negative input is applied to the drain of one power element can be extracted to this direct bonding region 23, and as a result a parasitic effect can be avoided.

As has been described above, a semiconductor device according to the present invention and a method of producing same achieve a compact intelligent power IC having a plurality of power element output portions and logic portions and with excellent heat-radiating performance and noise-withstand characteristics.

Additionally, according to the present embodiment a power element or logic element is formed individually by means of trenches for isolation from other power elements or logic elements. However, a point of the present invention is to separate the element-formation substrate into a pn isolation region and an SOI isolation region, is not necessarily required that either power elements or logic elements be separated among themselves. However, as was described according to this present embodiment, it is preferable to isolate these by means of isolation trenches. Furthermore, the numerical values in the description of the embodiment are not exclusively limited to the values stated, but may be modified as desired.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor device comprising:

a semiconductor substrate of a first conductivity type;

a semiconductor layer of a second conductivity type disposed on said semiconductor substrate such that a pn junction is defined therebetween, said semiconductor layer having a first element region, a second element region, a parasitic current extracting region disposed between said first and said second element regions, a first isolation region isolating said first element region from both said second element region and said extracting region, and a second isolation region isolating said second element region from both said first element region and said extracting region;

a first power semiconductor element disposed in said first element region; and a second power semiconductor element disposed in said second element region, wherein each of said first and said second isolation regions includes:

an oxide film positioned at a bottom of said first and said second isolation regions adjacent said semiconductor substrate and at said pn junction;

an insulating substance disposed so as to define side walls of said respective first and second isolation regions; and a semiconductor region composed of said semiconductor layer isolated by said oxide film and said side walls, and wherein said parasitic current extracting region has an electric potential that is at most equal to a lowest electric potential applied to one of said first and said second element regions.

2. A semiconductor device according to claim 1, further comprising doping layers of said second conductivity type, an impurity concentration of which is higher than that of said semiconductor layer, disposed at an interface between said semiconductor substrate and said semiconductor layer to thereby shift said pn junction into said semiconductor substrate.

3. A semiconductor device according to claim 1, further comprising a first, a second diffusion layer and a third diffusion layer, each being said second conductivity type, located under said first element region, said second element region and said extracting region, respectively, so as to separate said first element region, said second element region and said extracting region from said semiconductor substrate.

4. A semiconductor device according to claim 3, wherein said first diffusion layer contacts said oxide film of said first isolation region, said second diffusion layer contacts said oxide film of said second isolation region, and said third diffusion layer contacts both said oxide films of said first and said second isolation regions.

5. A semiconductor device according to claim 4, wherein said first, second and third diffusion layers extend into said semiconductor substrate and are located separately from each other.

6. A semiconductor device according to claim 5, wherein a distance between said first diffusion layer and said third diffusion layer under said first isolation region, and a distance between said second diffusion layer and said third diffusion layer under said second isolation region are selected in association with widths of said semiconductor regions disposed in said first and said second isolation regions, respectively, so as to prevent reach-through phenomena from occurring.

7. A semiconductor device according to claim 1, wherein said semiconductor region disposed in said first isolation region has a width which prevents a reach-through phenomenon from occurring between said parasitic current extracting region and said first element region, and said semiconductor region disposed in said second isolation region has a width which prevents a reach-through phenomenon from occurring between said parasitic current extracting region and said second element region.

8. A semiconductor device according to claim 1, wherein said semiconductor layer includes a third element region which is surrounded by an insulating layer on sides and a bottom thereof to be isolated from said semiconductor substrate, said first and said second element region, and said parasitic current extracting region.

9. A semiconductor device according to claim 8, further comprising a logic semiconductor element disposed in said third element region.

10. A semiconductor device comprising:

a semiconductor substrate of a first conductivity type;

a first semiconductor region of a second conductivity type disposed on said semiconductor substrate with a first pn junction disposed therebetween, in which is disposed a first power semiconductor element isolated from said semiconductor substrate by means of said first pn junction;

a second semiconductor region of said second conductivity type disposed on said semiconductor substrate with a second pn junction disposed therebetween, in which is disposed a second power semiconductor element isolated from said semiconductor substrate by means of said second pn junction;

a third semiconductor region of said second conductivity type disposed on said semiconductor substrate with a third pn junction disposed therebetween, positioned between said first and said second semiconductor regions;

a potential applying means for applying an electric potential to said third semiconductor region, said electric potential being at most equal to a lowest electric potential applied to one of said first and said second semiconductor regions, whereby said third semiconductor region extracts a parasitic current;

a first isolation region positioned between said first and said third semiconductor regions, disposed on said semiconductor substrate and isolating said first semiconductor region from both said second and said third semiconductor regions, said first isolation region having a fourth semiconductor region which is surrounded by an insulating layer on sides and bottom thereof, wherein a width of said fourth semiconductor region is selected so as to prevent a reach-through phenomenon between said first and said third semiconductor regions from occurring; and a second isolation region positioned between said second and said third semiconductor regions, disposed on said semiconductor substrate and isolating said second semiconductor region from both said first and said third semiconductor regions, said second isolation region having a fifth semiconductor region which is surrounded by an insulating layer on sides and bottom thereof, wherein a width of said fifth semiconductor region selected so as to prevent a reach-through phenomenon between said second and said third semiconductor regions from occurring.

11. A semiconductor device according to claim 10, wherein:

said insulating layer surrounding said fourth semiconductor region of said first isolation region includes a first oxide film positioned between said fourth semiconductor region and said semiconductor substrate, a first insulating substance communicating with said first oxide film to separate said first and said fourth semiconductor regions, and a second insulating substance communicating with said first oxide film to separate said third and said fourth semiconductor regions; and said insulating layer surrounding said fifth semiconductor region of said second isolation region includes a second oxide film positioned between said fifth semiconductor region and said semiconductor substrate, a third insulating substance communicating with said second oxide film to separate said second and said fifth semiconductor regions, and a fourth insulating substance communicating with said second oxide film to separate said third and said fifth semiconductor regions.

12. A semiconductor device according to claim 11, further comprising a first, a second and a third diffusion layer, each being said second conductivity type, located under said first semiconductor region, said second semiconductor region and said third semiconductor region, respectively, so as to separate said first element region, said second element region and said third semiconductor region from semiconductor substrate.

13. A semiconductor device according to claim 12, wherein said first diffusion layer contacts both said first oxide film and said first insulating substance, said second diffusion layer contacts both said second oxide film and said third insulating substance, and said third diffusion layer contacts both said first oxide film and said second insulating substance as well as both said second oxide film and said fourth insulating substance.

14. A semiconductor device according to claim 13, wherein said first, second and third diffusion layers extend into said semiconductor substrate and are located separately from each other.

15. A semiconductor device comprising:

a semiconductor substrate of a first conductivity type;

a first semiconductor region disposed on said semiconductor substrate and having a first diffusion layer of a second conductivity type which is located at a bottom of said first semiconductor region to define a first pn junction between said semiconductor substrate and said first semiconductor region;

a second semiconductor region disposed on said semiconductor substrate and having a second diffusion layer of said second conductivity type which is located at a bottom of said second semiconductor region to define a second pn junction between said semiconductor substrate and said second semiconductor region; and an isolation region disposed on said semiconductor substrate and positioned between said first and said second semiconductor regions to separate said first and said second semiconductor regions, said isolation region including:

a third semiconductor region, an oxide film positioned between a bottom of said third semiconductor region and said semiconductor substrate, a first insulating substance communicating with said oxide film to separate said first and said third semiconductor regions, and a second insulating substance communicating with said oxide film to separate said second and said third semiconductor regions, and wherein said first diffusion layer extends into said semiconductor substrate and contacts both said oxide film and said first insulating substance, said second diffusion layer extends into said semiconductor substrate and contacts both said oxide film and said second insulating substance, and said third semiconductor region is selected such that a width between said first and said second insulating substances prevents said first and said second diffusion layers from overlapping.

16. A semiconductor device according to claim 15, wherein said width between said first and said second insulating substances of said third semiconductor region is selected so as to prevent a reach-through phenomenon between said first and said second diffusion layers from occurring.

* * * * *